(12) United States Patent
Park et al.

(10) Patent No.: US 7,998,862 B2
(45) Date of Patent: Aug. 16, 2011

(54) METHOD FOR FABRICATING SEMICONDUCTOR DEVICE

(75) Inventors: Kunsik Park, Daejeon (KR); Kyu-Ha Baek, Daejeon (KR); Lee-Mi Do, Daejeon (KR); Dong-Pyo Kim, Daejeon (KR); Ji Man Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 30 days.

(21) Appl. No.: 12/689,344

(22) Filed: Jan. 19, 2010

(65) Prior Publication Data

US 2011/0136338 A1     Jun. 9, 2011

(30) Foreign Application Priority Data

Dec. 9, 2009 (KR) .................. 10-2009-0121573

(51) Int. Cl.
    *H01L 21/4763*   (2006.01)
    *H01L 21/44*     (2006.01)
(52) U.S. Cl. ........ 438/667; 438/627; 438/653; 438/668; 438/672; 438/675; 257/E21.575; 257/E21.577; 257/E21.584; 257/E21.597
(58) Field of Classification Search ........... 257/E21.575, 257/E21.577, E21.584, E21.597
    See application file for complete search history.

(56) References Cited

U.S. PATENT DOCUMENTS

| | | | |
|---|---|---|---|
| 6,953,745 B2 | 10/2005 | Ahn et al. | |
| 7,081,408 B2 * | 7/2006 | Lane et al. | 438/637 |
| 2009/0035940 A1 | 2/2009 | Richardson et al. | |
| 2009/0102021 A1 * | 4/2009 | Chen et al. | 257/621 |
| 2009/0224405 A1 * | 9/2009 | Chiou et al. | 257/758 |
| 2010/0159643 A1 * | 6/2010 | Takahashi et al. | 438/108 |

FOREIGN PATENT DOCUMENTS

| | | |
|---|---|---|
| JP | 3084021 B2 | 9/2000 |
| JP | 2003-218200 | 7/2003 |

OTHER PUBLICATIONS

Okuno, Atsushi et al., "Filling the via hold of IC by VPES (Vacuum Printing Encapsulation Systems) for stacked chip (3D packaging)", 2002 Electronic Components and Technology Conference, 2002, pp. 1444-1448, IEEE.

Keigler, Arthur et al., "Optimized TSV Filling Processes Reduce Costs", Semiconductor International, May 2009, pp. 19-22, vol. 32.

* cited by examiner

*Primary Examiner* — Mohsen Ahmadi

(57) ABSTRACT

A method of fabricating a semiconductor device includes forming a via hole in a semiconductor substrate, forming an isolation layer on an inner side of the via hole, forming a diffusion barrier layer over an upper portion of the semiconductor substrate and the inner side of the via hole where the isolation layer is formed, arranging a solvent, which contains electrically charged metal particles, on the semiconductor substrate where the diffusion barrier layer is formed, and filling the via hole with the metal particles by moving the metal particles using applied external force. The applied external force said includes a voltage causing an electric current to flow between the semiconductor substrate and the solvent, an electrical field applied between the semiconductor substrate and the solvent, or a magnetic field applied between the semiconductor substrate and the solvent.

17 Claims, 6 Drawing Sheets

METHOD FOR FABRICATING SEMICONDUCTOR DEVICE

CROSS-REFERENCE(S) TO RELATED APPLICATION(S)

The present invention claims priority of Korean Patent Application No. 10-2009-0121573, filed on Dec. 9, 2009, which is incorporated herein by reference.

FIELD OF THE INVENTION

The present invention relates to a method for fabricating a semiconductor device, and more particularly, to a method of filling a via-hole in a semiconductor substrate with metal.

BACKGROUND OF THE INVENTION

In recent years, electronic products have had smaller size and lighter weight. With such a trend, semiconductor devices have also become increasingly smaller with more enhanced functionalities, thereby making it necessary to develop various semiconductor packaging technologies. Among them, so-called TSV (Through Silicon Via) package is drawing attentions due to its high performance but micromini size. In such a TSV packaging process, after TSV is formed through a bond pad region of a silicon die, it is filled with metal so as to form a through electrode.

It is now explained in more detail about the TSV packing process. The process includes the steps of: forming a via hole in a silicon wafer; forming an isolation layer and a diffusion barrier layer in that order on an inner side of the via hole; filling the via hole with metal; thinning the silicon wafer; and forming and bonding a bump. Among those steps, the via filling step occupies about more than 40% of the total process cost. Accordingly, it is urgent and important to have a low cost via filling step in order to commercialize the TSV packaging process.

It is a CU electroplating technology that is more used than the other prior art via filling technologies. The CU electroplating technology has been widely used after the development of a CU damascene process, but yet there are many problems in applying it to the via filling step of the TSV packaging process.

In detail, since the via hole of the TSV package is much bigger than what can be formed by the damascene process in its diameter of about 1 to 200 micrometers and in its depth of about 10 to 300 micrometers, it takes too much time to fill the via hole by using the CU electroplating technology, and additives and process conditions should be very carefully controlled to prevent void problem inside the via hole or an overburden problem at a top portion of via hole.

Recently, a dry filling method is suggested as an alternative to the CU electroplating technology that would result in such a long processing time. In the dry filling method, after a via hole is formed in a substrate, those steps of printing a metal paste, decompression, and compression are repeated by using a VPES (Vacuum Printing Encapsulation System) so as to fill the via hole with the metal paste, which is then cured to finally form a metal electrode. Such a dry filling method, however, needs a very expensive equipment that is capable of decompressing and compressing as well as printing the metal paste in a vacuum condition. Further, it is difficult to fabricate a dense electrode because voids may be relatively easily formed in an organic material portion of the metal paste during the step of curing. Another problem is that a residue of the metal paste cannot be easily removed from a wafer.

SUMMARY OF THE INVENTION

In view of the above, the present invention provides to a method for fabricating a semiconductor device capable of forming a via-hole in the semiconductor device in a cost effective manner.

In accordance with an aspect of the present invention, there is provided a method of fabricating a semiconductor device, which includes:

forming a via hole in a semiconductor substrate;

forming an isolation layer on an inner side of the via hole;

forming a diffusion barrier layer over an upper portion of the semiconductor substrate and the inner side of the via hole where the isolation layer is formed;

arranging a solvent, which contains electrically charged metal particles, on the semiconductor substrate where the diffusion barrier layer is formed; and filling the via hole with the metal particles by moving the metal particles using applied external force.

According to the present invention, the applied external force said includes a voltage causing an electric current to flow between the semiconductor substrate and the solvent, and a first and a second voltage are respectively applied to the diffusion barrier layer and the solvent and a third voltage is applied to a lower portion of the semiconductor substrate, wherein each of the first and second voltage has the same polarity as that of the metal particles and the third voltage has an opposite polarity to that of the metal particles.

According to the present invention, the applied external force includes an electrical field applied between the semiconductor substrate and the solvent, and a voltage having the same polarity as that of the metal particles is applied to the diffusion barrier layer.

According to the present invention, the applied external force includes a magnetic field applied between the semiconductor substrate and the solvent, and a voltage having the same polarity as that of the metal particles is applied to the diffusion barrier layer.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described in detail with reference to the accompanying drawings so that they can be readily implemented by those skilled in the art.

Though the below embodiments are related to a step of filling a via hole with metal for a 3D IC package, they may be applied to the other various semiconductor fabrication processes such as a process of filling a via hole with metal for a multi-layer printed circuit board.

Figure 1:
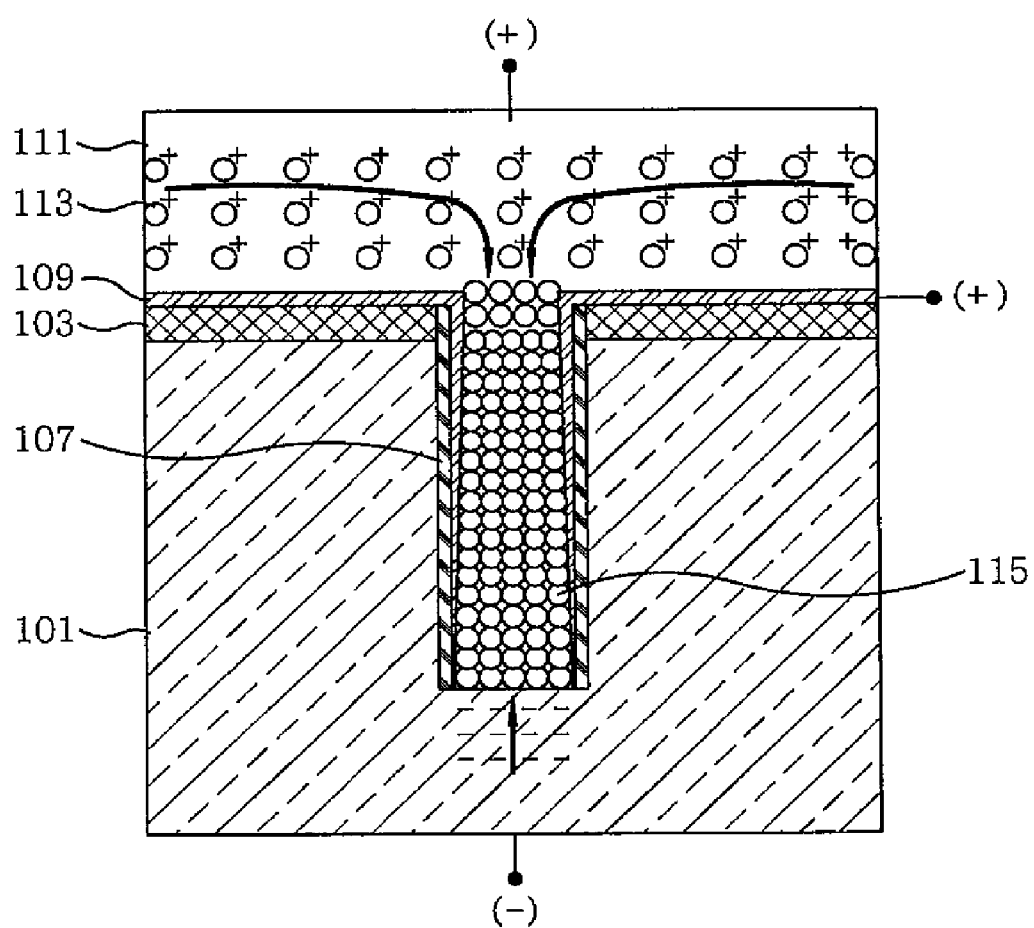
FIG. 1 is a cross-sectional view illustrating a process of filling a via hole with metal particles by using a method of fabricating a semiconductor device in accordance with an embodiment of the present invention.

FIG. 1 is a cross-sectional view illustrating a process of filling a via hole with metal particles by using a method of fabricating a semiconductor device in accordance with an embodiment of the present invention. Referring to FIG. 1, the process of filling the via hole will be explained briefly.

After the via hole 105 is formed in a semiconductor substrate 101 where a first isolation layer 103 is formed, a second isolation layer 107 is formed on an inner side wall of the via hole 105; and a diffusion barrier layer 109 is formed on the first isolation layer 103 and the second isolation layer 107 inside the via hole 105. The second isolation layer 107 makes it possible to electrically insulate the diffusion barrier layer 109 against the semiconductor substrate 101 in the via hole 105. Then, a solvent 111 containing electrically charged metal particles 113 is arranged over the semiconductor substrate 101 where the via hole 105, the first and the second isolation layer 103 and 107, and the diffusion barrier layer 109 are formed. Then, an applied external force such as electric or magnetic force is applied between an upper and a lower portion of the semiconductor substrate 101 to force the metal particles 113 to move in a desired direction, so that the metal particles 113 can be stacked serially from a bottom to a top portion of the via hole 105 to fill the via hole 105.

FIGS. 2A to 2J show cross-sectional views for sequentially illustrating a method of fabricating a semiconductor device in accordance with an embodiment of the present invention. Referring to FIGS. 2A to 2J, the semiconductor fabricating method will be explained in more detail.

The semiconductor fabricating method according to an embodiment of the present invention includes the steps of: forming a first isolation layer 103 on an upper portion of a semiconductor substrate 101; forming a via hole 105 in the semiconductor substrate 101 through the first isolation layer 103; forming a second isolation layer 107 on an inner side wall of the via hole 105; forming a diffusion barrier layer 109 on the first isolation layer 103 formed on the upper portion of the semiconductor substrate 101, and on the second isolation layer 107 formed inside the via hole 105; arranging a solvent 111, which contains electrically charged metal particles 113, over the upper portion of the semiconductor substrate where the diffusion barrier layer 109 is formed; filling the via hole 105 with the metal particles 113 by forcing the metal particles 113 to move in a desired direction using an applied external force such as electric or magnetic force; removing the solvent 111 after the via hole 105 is filled with the metal particles 113 by its top portion; and curing the semiconductor substrate 101 after removing the solvent 111.

The semiconductor fabricating method will be described in detail hereinafter.

Figure 2A:
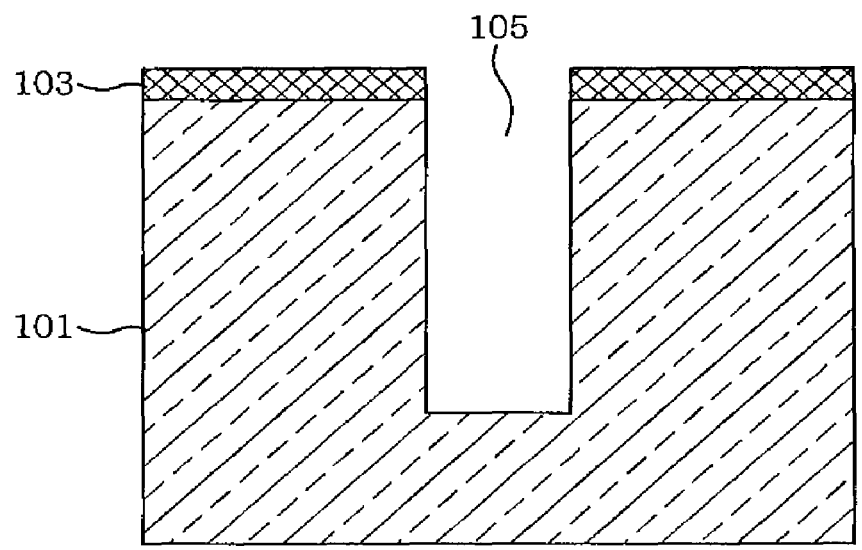
FIGS. 2A to 2J show cross-sectional views for sequentially illustrating a method of fabricating a semiconductor device in accordance with an embodiment of the present invention.

First of all, in FIG. 2A, after the first isolation layer 103 such as metal oxide is formed on the semiconductor substrate 101, the via hole 105 is formed through the first isolation layer 103 into the semiconductor substrate 101 by using, for example, a deep reactive ion etching process.

Figure 2B:
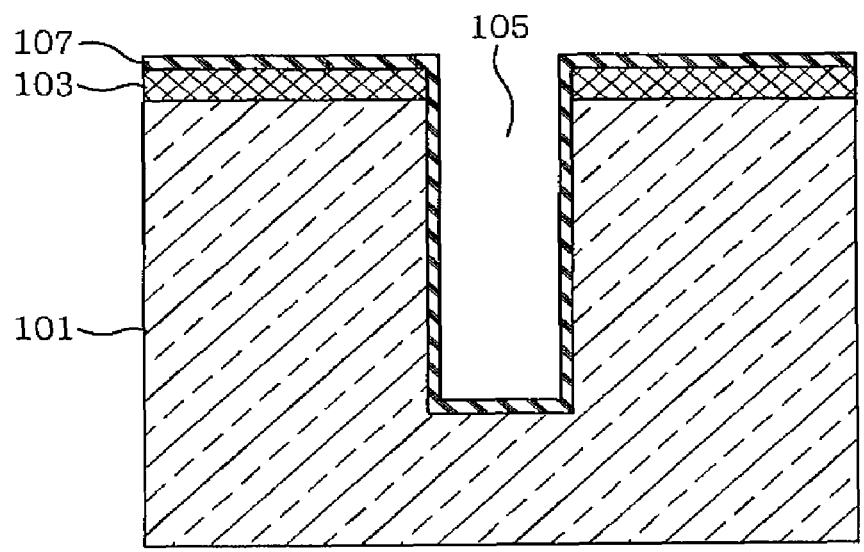

In FIG. 2B, an isolation material 107 such as silicon oxide ($SiO_2$), silicon nitride (SiN) or oxidized silicon nitride (SiON) is deposited on the semiconductor substrate 101 by using a PECVD (Plasma Enhanced Chemical Vapor Deposition) process, for example.

Figure 2C:
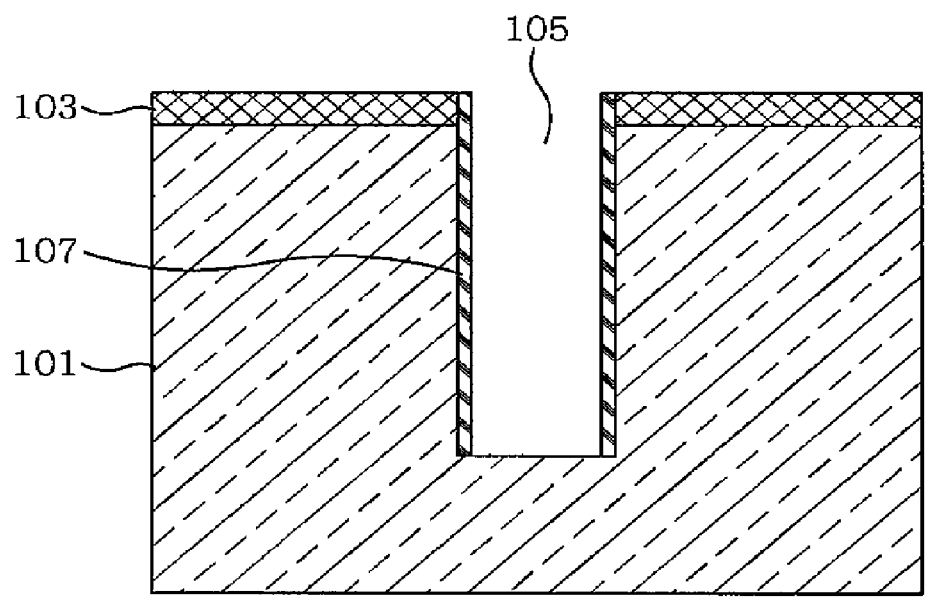

In FIG. 2C, a desired portion of the isolation material of FIG. 2B is removed by using an etching process, so that a portion of the semiconductor substrate 101 can be exposed at a bottom portion of the via hole 105 and at least some portions of the first isolation layer 103 can be exposed through the isolation material of FIG. 2B, thereby completing the second isolation layer 107.

Figure 2D:
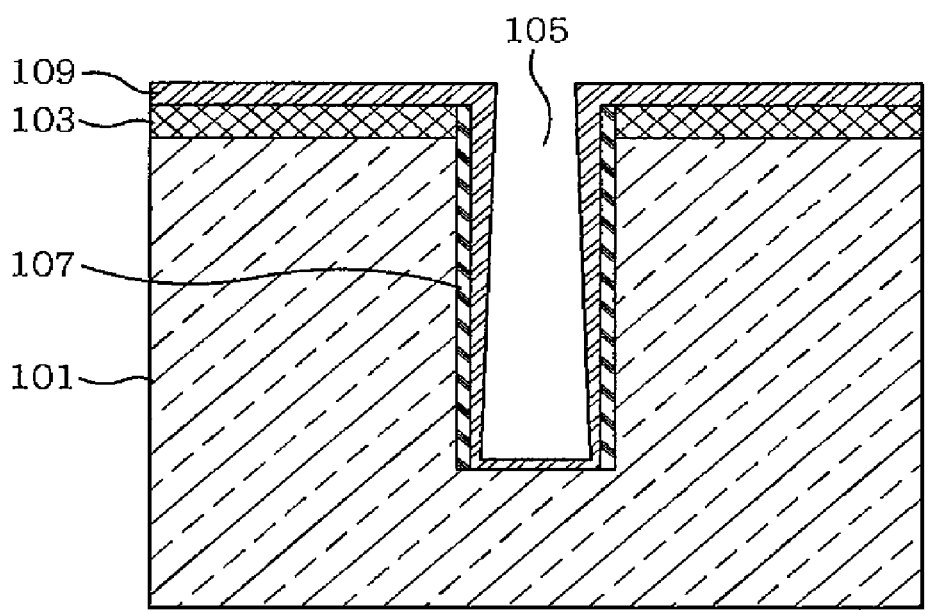

In FIG. 2D, after the second isolation layer 107 is formed on the inner side wall of the via hole 105, a diffusion barrier layer 109 is formed over the semiconductor substrate 101 by using a deposition process such as a PVD (Physical Vapor Deposition). At this point, in the deposition process used for forming the diffusion barrier material 109, the deposition process having a good step coverage characteristic may be generally employed to obtain an even thickness of the diffusion barrier material 109. In contrast, the present invention employs the deposition process having a relatively poor step coverage characteristic, so that the thickness of the diffusion barrier material 109 can be gradually decreasing as it goes from above the upper portion of the semiconductor substrate 101 to a bottom portion of the via hole 105. Accordingly, it is possible to make the diffusion barrier material 109 thinner at the bottom portion of the via hole 105 than at above the upper portion of the semiconductor substrate 101, and, therefore, the diffusion barrier material 109 can be more easily removed at the bottom portion of the via hole 105 in the next processes, in spite of the relatively higher aperture ratio of the via hole 105. There are various PVDs such as a sputtering process, an E-beam evaporation method, a thermal evaporation method, a laser molecular beam epitaxy technology, and a pulsed laser deposition or the like. Among them, for example, the sputtering process may be used to deposit the diffusion barrier material 109 in an embodiment of the present invention.

Figure 2E:
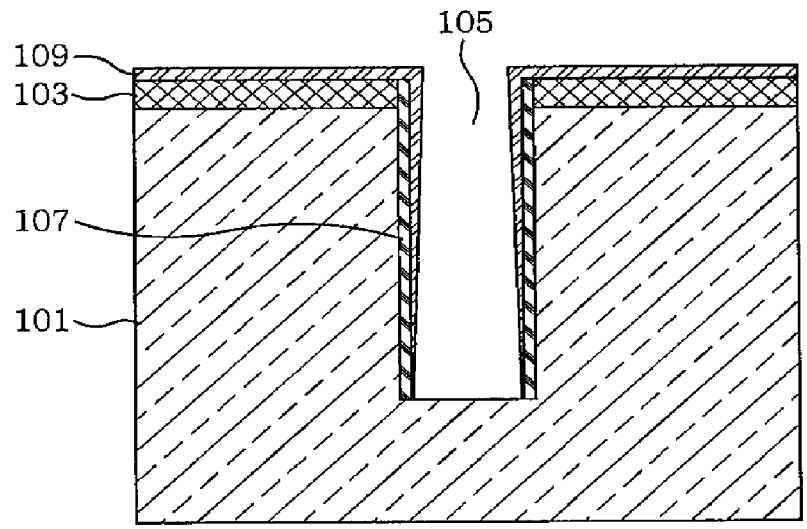

In FIG. 2E, the diffusion barrier material of FIG. 2D is anisotropically etched by using, for example, a reactive ion etching process, so that it remains on the first isolation layer 103 and on the inner side wall of the via hole 105 while being removed from the bottom portion of the via hole 105 to expose the corresponding portion of the semiconductor substrate 101, thereby completing the diffusion barrier layer 109. Herein, the second isolation layer 107 on the inner side wall of the via hole 105 electrically insulates the diffusion barrier layer 109 against the semiconductor substrate 101 at this area.

Figure 2F:
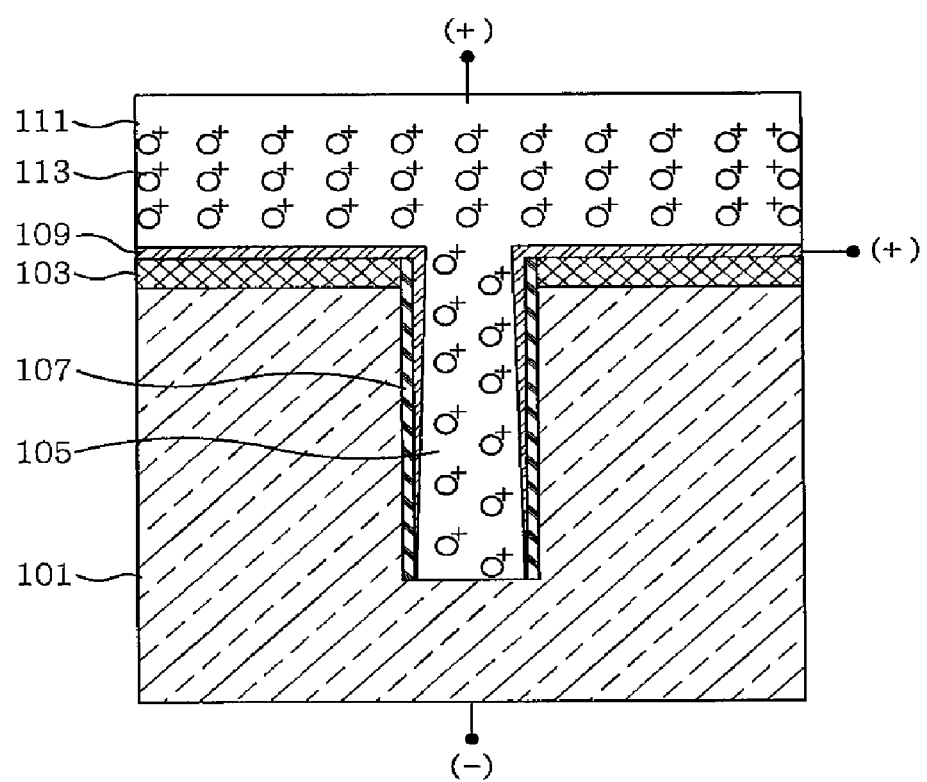

In FIG. 2F, the semiconductor substrate 101 having the diffusion barrier layer 109 is dipped into the solvent 111 that is mixed with the metal particles 113, which are electrically charged at a single polarity of positive (+) or negative (−) and have sizes in a range of a few nanometers to several micrometers. Herein, all the metal particles 113 in FIG. 2F are shown to have the positive polarity for the convenience of explanation. Then, a first and a second voltage each having the same polarity as that of the electrically charged metal particles 113 are respectively applied to the diffusion barrier layer 109 and the solvent 111, while a third voltage having an opposite polarity to that of the metal particles 113 is applied to a lower portion of the semiconductor substrate 101, thereby causing an electric current. The electrical charging of the metal particles 113 may be accomplished by using various ways such as friction, plasma charging, or a surface additive. Because the electrically charged metal particles 113 have the single polarity, they can be easily and uniformly dispersed in the solvent 111. A surfactant may be added to the solvent 111 to enhance the dispersion of the metal particles 113. In accordance with another embodiment of the present invention, an external force such as an electric or a magnetic field may be applied between the solvent 111 and the lower portion of the semiconductor substrate 101. Further, the first voltage applied to the diffusion barrier layer 109 may have the same polarity as that of the electrically charged metal particles 113.

Figure 2G:
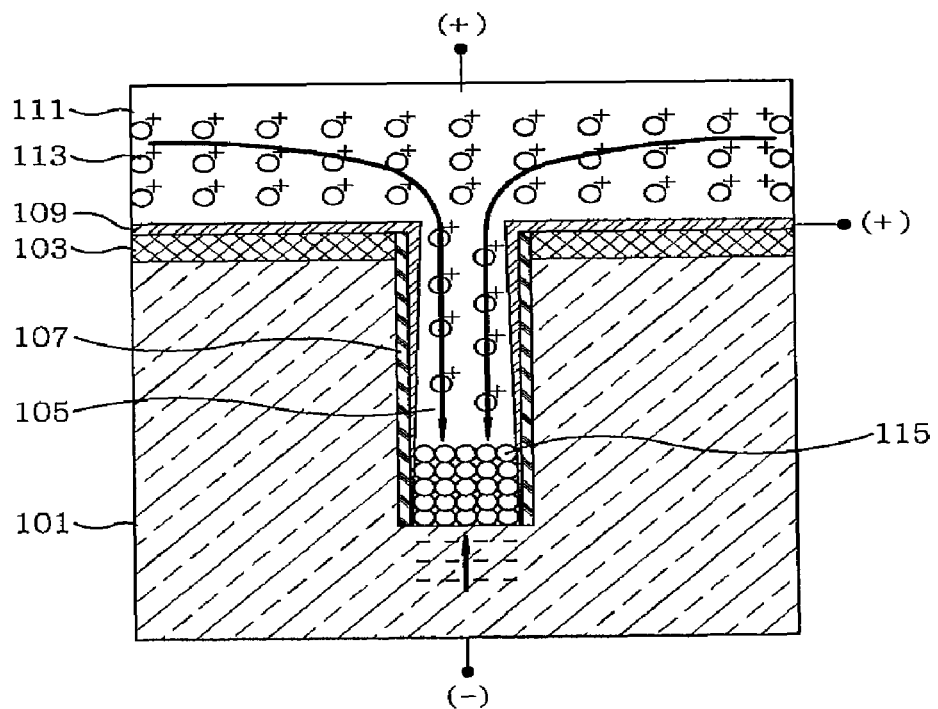

In FIG. 2G, the electrically charged metal particles 113 are forced to move in a desired direction by the electric current, the electric field, or the magnetic field so as to be serially stacked in the via hole 105 from its bottom portion, and those metal particles 113 field in the via hole 105 are electrically discharged due to the opposite polarity voltage applied to the lower portion of the semiconductor substrate 101. Herein, the first voltage applied to the diffusion barrier layer 109 may be controlled to be lower than the second voltage applied to the solvent 111 so as to make it easier for the electrically charged metal particles 113 to move into the via hole 105. In addition, the metal particles may have at least two different sizes so as to fill the via hole 105 more densely. As explained above, because the metal particles 113 are forced to move in a desired direction by using the applied external force such as the electric current, the electric field, or the magnetic field, it is possible to fill the via hole 105 serially from its bottom portion, thereby preventing or at least minimizing a void creation in the via hole 105.

Figure 2H:
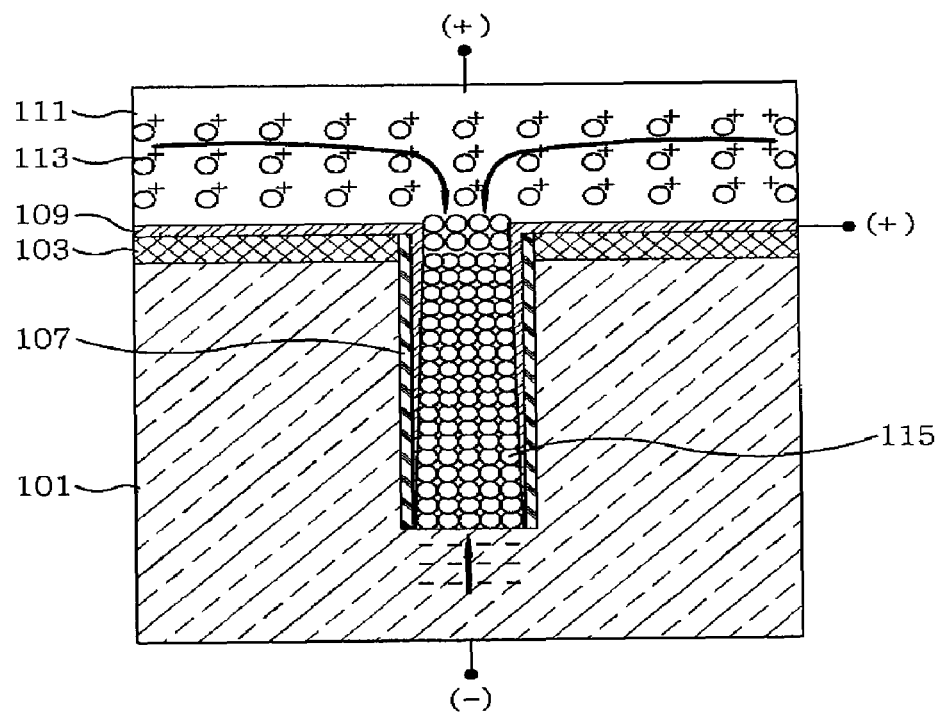

In FIG. 2H, when the via hole 105 is filled with the metal particles 115 by its top portion, the first to the third electric voltage respectively applied to the semiconductor substrate 101, the diffusion barrier layer 109, and the solvent 111 are stopped or the electric or the magnetic field is removed. Then, the solvent 111 is also removed, thereby forming a through silicon via, where the via hole 105 is filled with the metal particles 115, as shown in FIG. 2I.

Figure 2I:
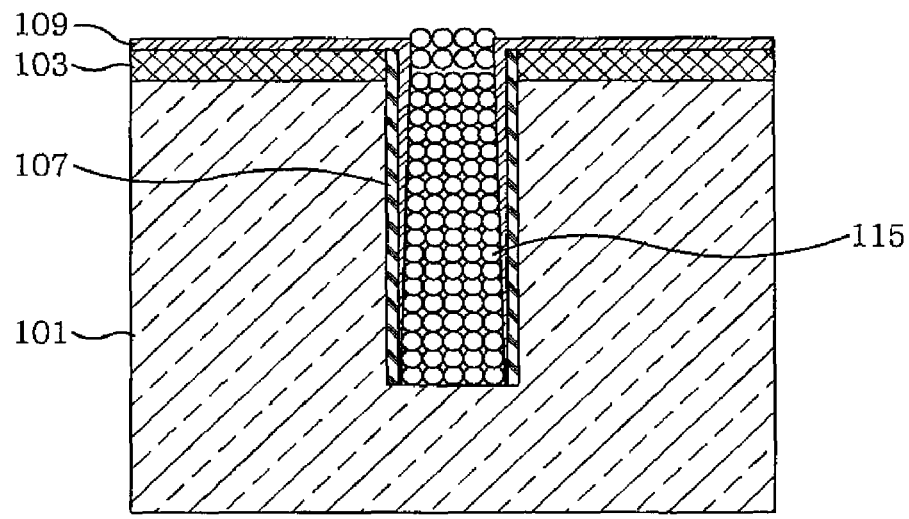
Figure 2J:
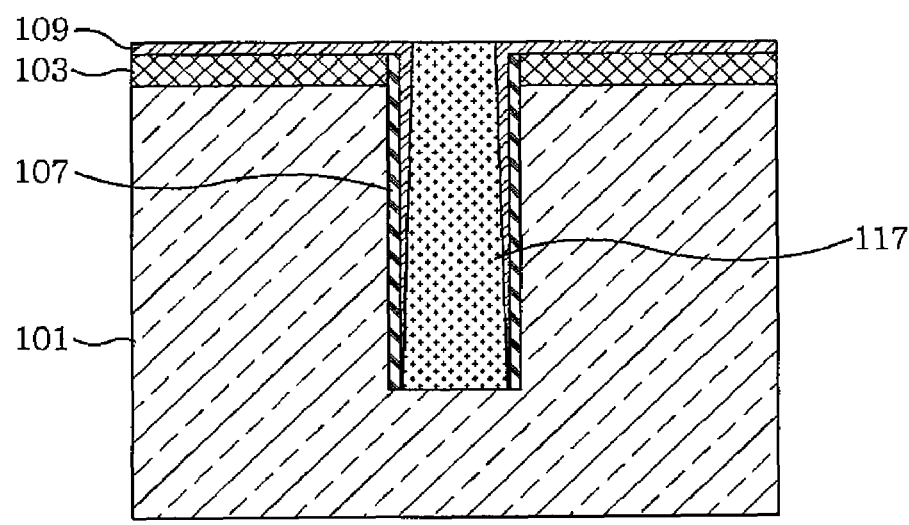

Referring to FIG. 2I, the through silicon via filled with the metal particles 115 is cured at a temperature of about 100° C. to 400° C., thereby completing a TSV metal interconnection 117 as shown in FIG. 2J.

Compared with the prior art CU electroplating technology, because the large and deep via hole can be filled with the metal particles in a relatively short time in accordance with the present invention, expense and processing time for the TSV can be greatly reduced. Further, compared with the prior art dry filling method that uses the metal paste having a relatively larger resin portion, the present invention uses the electrically charged metal particles, thereby making it possible to form the relatively denser TSV metal interconnection.

While the invention has been shown and described with respect to the preferred embodiments, it will be understood by those skilled in the art that various changes and modifications may be made without departing from the scope of the invention as defined in the following claims.

What is claimed is:

1. A method of fabricating a semiconductor device, comprising:
   forming a first isolation layer on a semiconductor substrate;
   forming a via hole through the first isolation layer in the semiconductor substrate;
   forming a second isolation layer on an inner side including a bottom of the via hole;
   removing the bottom portion of the second isolation layer so as to expose a portion of the semiconductor substrate;
   forming a diffusion barrier layer over an upper portion of the semiconductor substrate and the inner side of the via hole including the bottom portion of the via hole where the second isolation layer is formed by depositing a diffusion barrier material over the substrate where the second isolation layer is formed and anisotropically etching the diffusion barrier material to expose the bottom portion of the semiconductor substrate through the bottom portion of the via hole;
   arranging a solvent, which contains electrically charged metal particles, on the semiconductor substrate where the diffusion barrier layer is formed;
   filling the via hole with the metal particles by moving the metal particles using applied external force, the applied external force including a voltage causing an electric current to flow between the semiconductor substrate and the solvent;
   removing the solvent after the via hole is filled with the metal particles by its top portion; and
   curing the semiconductor substrate after removing the solvent.

2. The method of claim 1, wherein a first and a second voltage are respectively applied to the diffusion barrier layer and the solvent, and
   a third voltage is applied to a lower portion of the semiconductor substrate,
   wherein each of the first and second voltage has the same polarity as that of the metal particles and the third voltage has an opposite polarity to that of the metal particles.

3. The method of claim 2, wherein the first voltage applied to the diffusion barrier layer is made different from the second voltage applied to the solvent so as to promote the filling more efficiently.

4. The method of claim 1, wherein the applied external force includes an electrical field applied between the semiconductor substrate and the solvent.

5. The method of claim 4, further comprising applying a voltage having the same polarity as that of the metal particles to the diffusion barrier layer.

6. The method of claim 1, wherein the applied external force includes a magnetic field applied between the semiconductor substrate and the solvent.

7. The method of claim 6, further comprising applying a voltage having the same polarity as that of the metal particles to the diffusion barrier layer.

8. The method of claim 1, wherein the via hole is filled by using a deep reactive ion etching process.

9. The method of claim 1, wherein said forming the isolation layer includes:
   depositing an isolation material on the semiconductor substrate where the via hole is formed; and
   etching a whole surface of the semiconductor substrate where the isolation material is deposited so that a portion of the semiconductor substrate is exposed through a bottom portion of the via hole.

10. The method of claim 9, wherein the isolation material is deposited by using a PECVD (Plasma Enhanced Chemical Vapor Deposition) process.

11. The method of claim 1, wherein a thickness of the diffusion barrier layer is gradually decreasing as it goes from the upper portion of the semiconductor substrate to a bottom portion of the via hole.

12. The method of claim 1, wherein the diffusion barrier material is deposited by using a PVD (Physical Vapor Deposition) process.

13. The method of claim 1, wherein the diffusion barrier material is deposited by using a sputtering process.

14. The method of claim 13, wherein the electrically charged metal particles are those ones that are electrically charged by using friction, plasma charging, or a surface additive.

15. The method of claim 13, wherein the solvent contains a surfactant added thereto in order to promote dispersion of the metal particles.

16. The method of claim 1, wherein the electrically charged metal particles have the same polarity.

17. The method of claim 1, wherein the metal particles have at least two different size particles mixed therein.

* * * * *